United States Patent
Kumar et al.

(10) Patent No.: US 10,418,941 B2
(45) Date of Patent: Sep. 17, 2019

(54) INTEGRATED CIRCUIT CRYSTAL OSCILLATOR HAVING DIGITAL AUTOMATIC GAIN CONTROL COMPRISING OSCILLATION DETECTION AND AMPLITUDE CONTROL LOOPS

(71) Applicant: Microchip Technology Incorporated, Chandler, AZ (US)

(72) Inventors: Ajay Kumar, Phoenix, AZ (US); Hyunsoo Yeom, Chandler, AZ (US); Qing Li, Mesa, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 143 days.

(21) Appl. No.: 15/634,881

(22) Filed: Jun. 27, 2017

(65) Prior Publication Data
US 2018/0006605 A1 Jan. 4, 2018

Related U.S. Application Data

(60) Provisional application No. 62/357,199, filed on Jun. 30, 2016.

(51) Int. Cl.
*H03B 5/36* (2006.01)
*H03B 5/04* (2006.01)
(Continued)

(52) U.S. Cl.
CPC .............. *H03B 5/362* (2013.01); *H03B 5/04* (2013.01); *H03B 5/06* (2013.01); *H03B 5/36* (2013.01);
(Continued)

(58) Field of Classification Search
CPC . H03B 5/36; H03B 5/364; H03B 5/32; H03B 5/362; H03B 5/06;
(Continued)

(56) References Cited

U.S. PATENT DOCUMENTS 7,292,114 B2 * 11/2007 Greenberg ............. H03B 5/364
331/116 FE
7,411,467 B2 * 8/2008 Alford ..................... H03B 5/36
331/116 R
(Continued)

FOREIGN PATENT DOCUMENTS

EP   1753126 A1   2/2007   ............... H03B 5/36
EP   2553541 A1   2/2013   ........... G01R 19/165
(Continued)

OTHER PUBLICATIONS

International Search Report and Written Opinion, Application No. PCT/US2017/040171, 14 pages, dated Sep. 28, 2017.

*Primary Examiner* — Ryan Johnson
(74) *Attorney, Agent, or Firm* — Slayden Grubert Beard PLLC

(57) ABSTRACT

A crystal oscillator is coupled to a digital automatic gain control (AGC) having oscillation detection and amplitude control loops. The oscillation detection loop may increase the transconductance (gm) of the oscillator transistor until oscillation is detected therefrom. Then the amplitude control loop detects the amplitudes of oscillations from the crystal oscillator, compares these amplitudes to high and low voltage references and generates digital signals to find a critical transconductance (gm) for an oscillator amplifier and control this gm to maintain a constant oscillation waveform amplitude therefrom. An up/down counter defines the servo control loop bandwidth/update-rate according to an update clock rate thereto. Loop stability is achieved when the control loop bandwidth is less than the start-up time required for the oscillation envelope of the crystal oscillator to grow for oscillation. An oscillator failure detector may also be provided.

21 Claims, 5 Drawing Sheets

(51) Int. Cl.
*B03B 5/06* (2006.01)
*H03G 3/30* (2006.01)
*H03B 5/06* (2006.01)

(52) U.S. Cl.
CPC ... *H03G 3/3036* (2013.01); *H03B 2200/0058* (2013.01); *H03B 2200/0066* (2013.01); *H03B 2200/0068* (2013.01); *H03B 2200/0094* (2013.01)

(58) Field of Classification Search
CPC .... H03B 2200/0094; H03B 2200/0046; H03B 2200/0058; H03B 2200/0082; H03L 3/00; H03L 5/00
See application file for complete search history.

(56) References Cited

U.S. PATENT DOCUMENTS

| | | | |
|---|---|---|---|
| 7,548,128 B2 | 6/2009 | Rosik et al. | 331/116 R |
| 2007/0096841 A1 | 5/2007 | Connell et al. | 331/183 |
| 2008/0068106 A1 | 3/2008 | Alford et al. | 331/158 |
| 2009/0224836 A1 | 9/2009 | Orberk et al. | 331/15 |
| 2015/0061786 A1 | 3/2015 | Mai | 331/116 FE |

FOREIGN PATENT DOCUMENTS

| | | | | |
|---|---|---|---|---|
| EP | 2634914 A1 | | 9/2013 | ............ H03B 5/06 |
| JP | S6064506 A | * | 4/1985 | |

* cited by examiner

INTEGRATED CIRCUIT CRYSTAL OSCILLATOR HAVING DIGITAL AUTOMATIC GAIN CONTROL COMPRISING OSCILLATION DETECTION AND AMPLITUDE CONTROL LOOPS

RELATED PATENT APPLICATION

This application claims priority to commonly owned U.S. Provisional Patent Application No. 62/357,199; filed Jun. 30, 2016; which is hereby incorporated by reference herein for all purposes.

TECHNICAL FIELD

The present disclosure relates to crystal oscillators, and, in particular, to a crystal oscillator with a digital automatic gain control (AGC) servo loop circuits for selecting optimal operating transconductance for the oscillating device and an oscillator fail detector.

BACKGROUND

An electronic oscillator generally includes a resonant circuit that produces a periodic, time-varying electrical signal of a given frequency—the inverse of the resonant circuit's period determines its frequency. The electrical signal may be used, for instance, to keep track of the passage of time by counting a number of signal oscillations. A common electronic oscillator employs a quartz crystal as its resonating element, although other types of piezoelectric materials (e.g., polycrystalline ceramics) may also be used.

Electronic oscillators have been used to generate clock signals for lots of electronic devices. Electronic oscillators are an important component of radio frequency (RF) and electronic devices. Today, product design engineers often do not find themselves designing oscillators because the oscillator circuitry is provided on the device. However, most current electronic oscillators have issues because of the analog AGC loop used with the electronic oscillators. For example, the analog AGC may cause instability in the AGC loop and/or improper starting of the oscillator when initial seed current is applied.

SUMMARY

It would be desirable to have systems and methods for AGC for controlling the gm of crystal oscillators that address the issues described hereinabove.

According to an embodiment, a method for operating a crystal oscillator of an integrated circuit may comprise the steps of: monitoring operation and controlling oscillation amplitude of a crystal oscillator with a digital automatic gain control (AGC) circuit coupled with the crystal oscillator, the digital AGC circuit comprising a first loop including an oscillation detector and a second loop including an oscillation amplitude detector; increasing gain of the crystal oscillator until oscillation therefrom may be detected with the first loop, and maintaining the oscillation at an amplitude between a high reference value and a low reference value with the second loop.

According to a further embodiment of the method, the step of detecting oscillation of the crystal oscillator may comprise the steps of counting a number of frequency cycles from the crystal oscillator, and setting an oscillation detection latch when the number of frequency cycles reaches a certain number of counts. According to a further embodiment of the method may comprise the steps of: generating independent update clock pulses; and increasing gain of a transconductance amplifier of the crystal oscillator at each update clock pulse if the oscillation detection latch has not yet been set.

According to a further embodiment of the method, the step of maintaining the oscillation amplitude between the high and low reference values may comprise the steps of: comparing outputs from the oscillation amplitude detector with the high and low reference values; increasing the transconductance amplifier gain at each update clock pulse if the output from the oscillation amplitude detector may be less than the low reference value, and decreasing the transconductance amplifier gain at each update clock pulse if the output from the oscillation amplitude detector may be equal to or greater than the high reference value.

According to a further embodiment of the method, transconductance amplifier gain may be increased by increasing current thereto. According to a further embodiment of the method may comprise the step of generating a crystal oscillator failure alarm when the oscillation detector does not detect an oscillation from the crystal oscillator within a certain time period. According to a further embodiment of the method, the high reference value may be about 300 millivolts above a DC bias point of a transistor of the crystal oscillator, and the low reference value may be about 100 millivolts above the DC bias point of the transistor. According to a further embodiment of the method may comprise the step of providing the high and low reference values that track power, voltage and temperature characteristics of the transconductance amplifier with a replica circuit. According to a further embodiment of the method may comprise the steps of detecting an oscillator failure and providing an alarm thereof.

According to another embodiment, an integrated circuit may comprise: a crystal oscillator circuit; and a digital automatic gain control (AGC) circuit coupled with the crystal oscillator circuit, the AGC circuit comprising a first loop including an oscillation detector and a second loop including an oscillation amplitude detector; wherein the first loop may be adapted to increase gain of the crystal oscillator circuit until an oscillation amplitude therefrom may be detected, and thereafter the second loop may be adapted to maintain the oscillation amplitude between high and low amplitude values.

According to a further embodiment, the crystal oscillator circuit may comprise: a transconductance amplifier adapted for coupling to the external crystal; and a programmable current source coupled to and controlling transconductance gain of the transconductance amplifier. According to a further embodiment, the first loop may control the programmable current source at update intervals before detection of oscillation from the crystal oscillator circuit; and the second loop controls the programmable current source the at update intervals after detection of the oscillation from the crystal oscillator circuit.

According to a further embodiment, the first loop may comprise: an oscillation detector, a memory latch coupled to the oscillation detector and changing logic state when the oscillation may be detected, and an up/down counter coupled to and controlling the programmable current source; the second loop may comprise: an oscillation amplitude detector having an input coupled to the transconductance amplifier and an output representing the oscillation amplitude, the up/down counter; and an oscillation amplitude controller coupled between the oscillation amplitude detector and the up/down counter, wherein: if the oscillation amplitude may be less than the low amplitude value then the up/down counter increments count values therein at the update intervals, and if the oscillation amplitude may be equal to or greater than the high amplitude value then the up/down counter decrements the count values therein at the update intervals.

According to a further embodiment, the high amplitude value may be about 300 millivolts above a DC bias point of the transconductance amplifier, and the low amplitude value may be about 100 millivolts above the DC bias point of the transconductance amplifier. According to a further embodiment, a replica circuit may be adapted to provide the high and low amplitude values that track power, voltage and temperature characteristics of the transconductance amplifier. According to a further embodiment, the count valve of the up/down counter and/or the oscillation detection circuit may be programmable. According to a further embodiment, the up/down counter may be adapted to be reset upon a power-on-reset in the integrated circuit. According to a further embodiment, the timer, oscillation detection circuit, latch and/or up/down counter may be resettable upon a reset condition in the integrated circuit. According to a further embodiment, an oscillator failure alarm circuit may be provided. According to a further embodiment, the integrated circuit may be a microcontroller.

BRIEF DESCRIPTION OF THE DRAWINGS

A more complete understanding of the present disclosure may be acquired by referring to the following description taken in conjunction with the accompanying drawings wherein.

Figure 1:
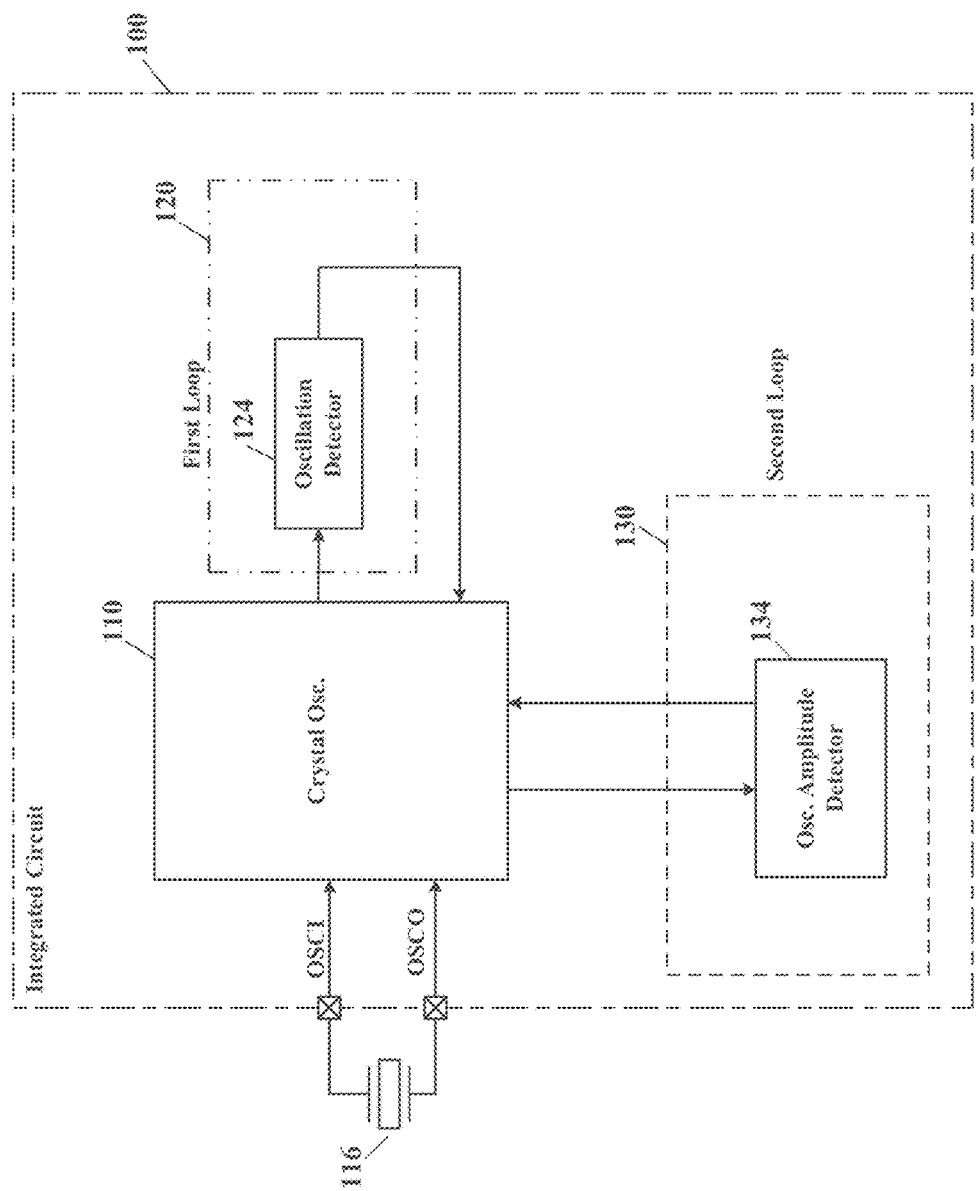
FIG. 1 illustrates a schematic block diagram of an integrated circuit crystal oscillator having digital automatic gain control (AGC) comprising oscillation detection and amplitude control loops, according to specific example embodiments of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the forms disclosed herein.

DETAILED DESCRIPTION

According to various embodiments, a digital automatic gain control (AGC) having first and second control loops. The first loop may increase the transconductance (gm) of an oscillator transistor until oscillation is detected therefrom. Then a second loop detects the amplitudes of oscillations from a crystal oscillator, compares these amplitudes to high and low voltage references and generates digital signals to find a critical transconductance (gm) of an oscillator transistor and control this transistor transconductance (gm) to maintain a constant oscillation waveform amplitude therefrom. An up/down counter defines the servo control loop bandwidth/update-rate according to a clock rate thereto, and this servo loop does not have any stability issue so long as the servo loop bandwidth is less than about Tau $(\tau)=10*Lm/R\_eff$ of the crystal oscillator. Transconductance is an expression of the performance of a bipolar transistor or field-effect transistor (FET). In general, the larger the transconductance figure for a device, the greater the gain (amplification) it can deliver, when all other factors are held constant.

In accordance with one aspect of the disclosure, an integrated circuit is provided. The integrated circuit includes an oscillator circuit coupled with an external crystal. The integrated circuit includes a digital automatic gain control (AGC) circuit coupled with the oscillator circuit. The digital AGC circuit includes a first loop function providing an oscillation detector and a second loop function providing an oscillation envelope detector.

In accordance with another aspect of the disclosure, a method is provided for operating an integrated circuit crystal oscillator. The method includes the following steps: First, an initial output of a counter in a digital gain control circuit is set to a first count value. The digital gain control is connected to a first loop (oscillation detection loop) that determines when an oscillation has occurred for a certain number of cycles. The digital gain control waits for a preset oscillation envelope expansion time (an expected number of oscillation cycles). The digital gain control may increase the oscillator transistor transconductance (gm) at a programmable update rate until the expected number of oscillation cycles is detected. Upon detecting the expected number of oscillation cycles, the digital gain control selects a second loop so that a transconductance current value settles within an envelope determined by high and low reference voltages coupled to two comparators that monitor a DC output from an oscillation amplitude detection circuit.

Referring now to the drawings, the details of example embodiments are schematically illustrated. Like elements in the drawings will be represented by like numbers, and similar elements will be represented by like numbers with a different lower-case letter suffix.

FIG. 1 illustrates a schematic block diagram of an integrated circuit crystal oscillator having digital automatic gain control (AGC) comprising oscillation detection and amplitude control loops, according to specific example embodiments of this disclosure. An integrated circuit 100, may comprise a crystal oscillator 110, a digital AGC comprising a first loop (oscillation detection loop) 120 and a second loop (an oscillation amplitude control loop) 130. The oscillation detection loop 120 will increase the transconductance of the crystal oscillator 110 until oscillation is detected therefrom. The oscillation amplitude control loop 130 will maintain the oscillation amplitude from the crystal oscillator 110 within certain upper and lower amplitude values. The crystal oscillator 110 is adapted for coupling to an external frequency determining crystal 116.

Figure 1A:
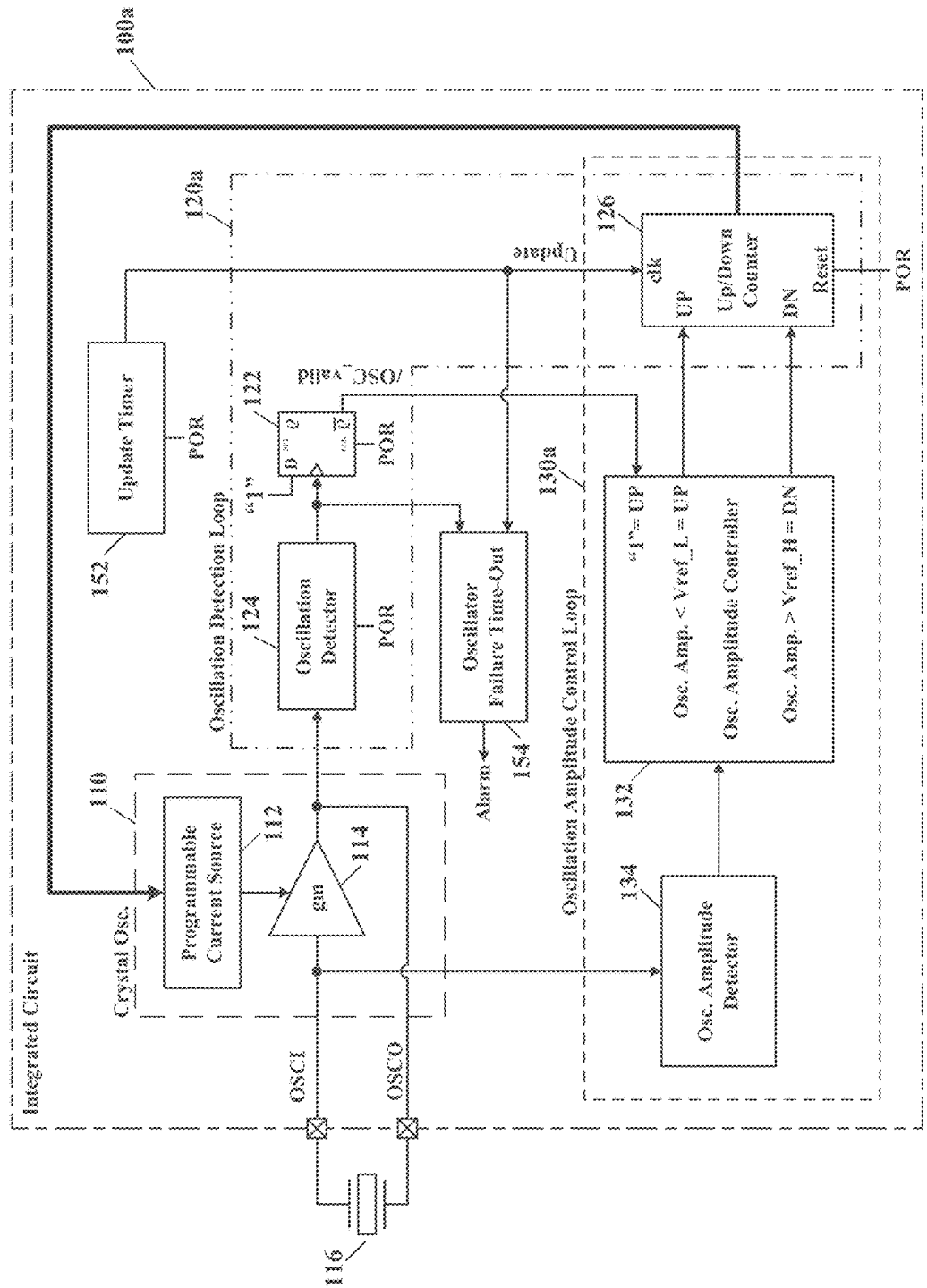
FIG. 1A illustrates a more detailed schematic block diagram of an integrated circuit crystal oscillator having digital automatic gain control (AGC) comprising oscillation detection and amplitude control loops, according to a specific example embodiment of this disclosure.

FIG. 1A illustrates a schematic block diagram of an integrated circuit crystal oscillator having digital automatic gain control (AGC) comprising oscillation detection and amplitude control loops, according to a more detailed specific example embodiment of this disclosure. An integrated circuit 100a, may comprise a crystal oscillator 110, a digital AGC comprising an oscillation detection loop 120a and an oscillation amplitude control loop 130a, an update timer 152, and, optionally, an oscillator failure detection and alarm circuit 154.

The crystal oscillator 110 may comprise a transconductance amplifier (e.g., bipolar or FET transistor) 114 whose transconductance (gm) may be controlled by current from a programmable current source 112. An external crystal 116 may be coupled to the crystal oscillator 110 through nodes (pins) OSCI and OSCO of the integrated circuit 100a.

The oscillation detection loop 120a may comprise an oscillation detector 124, a one bit memory latch 122, and an up/down counter 126. Upon power-up and/or initialization of the integrated circuit 100 the oscillation detector 124, one bit memory latch 122, and up/down counter 126 may be reset wherein the count values therein are reset to zero (0), and the memory latch 122 is cleared wherein its Q-output is at a logic low and /Q-output at a logic high. The up/down counter 126 is coupled to and controls the programmable current source 112, wherein when its count value is zero the output current from the programmable current source 112 is at its lowest value. The lowest value current from the programmable current source 112 is initially applied to the transconductance amplifier (transistor) 114 (transistor gain controlled by current), whereby its transconductance (gm) is at a minimum. Under this condition the crystal oscillator 110 may or may not oscillate, but it doesn't matter since the update timer 152 is independent of the crystal oscillator 110. The update timer 152 may be used to define the bandwidth/update rate for both the oscillation detection loop 120 ("first loop") and the oscillation amplitude control loop 130 ("second loop") as more fully explained hereinafter.

Before any Update clock is received by the Up/Down counter 126 (and the count value thereof is set to zero) a minimum current value is coupled to transconductance amplifier 114. Thus, the transconductance amplifier 114 starts at a minimum transconductance, and its transconductance increases as the current from the programmable current source 112 increases by control from the count value of the up/down counter 126. Each time the up/down counter 126 receives a clock pulse from the update timer 152, a linear thermometric pattern of current values (linearly increasing current) from the programmable current source 112 raises the transconductance (gm) until the oscillator circuit 110 starts to oscillate if it did not start to oscillate at the initial lowest current transconductance (gm) value.

Initially the one bit memory latch 122 Q-output is at a logic low ("0") ("OSC_valid") and the /Q-output at a logic high ("1") which forces the Up/Down counter 126 to increment its count value each time it receives an Update clock pulse from the update timer 152. The clock rate output from the update timer 152 (independent internal oscillator and counter) may be defined and fixed during design/manufacture or its internal counter may be programmable so as to be more flexible for use with crystals having different characteristics and/or frequencies. Preferably, the output clock frequency of the update timer 152 (defines the bandwidth of the first and second loops) may be slow enough to be less than Tau ($\tau$)=10*Lm/R_eff, the start-up time required for the oscillation envelope of the crystal oscillator to grow for oscillation. The update timer 152 output clock frequency is very easy to achieve. Therefore, the clock rate output from the update timer 152 defines the bandwidth/update-rates for both the oscillation detection loop 120 and the oscillation amplitude control loop 130a, thus there are no loop stability issues.

Once the crystal oscillator 110 output starts to drive the oscillation detector 124 a certain number of oscillation frequency cycles must occur before the one bit memory latch 122 output logic state changes, thereby transferring control of the Up/Down counter 126 from the oscillation detection loop 120a to the oscillation amplitude control loop 130a. An example implementation for the oscillation detector 124 may be a counter that counts the received oscillation frequency cycles from the crystal oscillator 110 a certain number of times before outputting a count overflow signal to the clock input of the one bit memory latch 122. For example, the count number may be 128, e.g., a count overflow occurs after receiving 128 oscillation frequency cycles.

The oscillation amplitude control loop 130a may comprise the up/down counter 126, an oscillation amplitude controller 132 and an oscillation amplitude detector 134. When the oscillation amplitude control loop 130a becomes active (once the one bit memory latch 122 output has changed from its initial logic state), the up/down counter 126 may increment or decrement a count value therein each time it receives an Update clock pulse from the update timer 152 depending upon the output of the oscillation amplitude detector 134 (representative of the oscillation amplitude of the crystal oscillator 110). This count value may be used to control the programmable current source 112 which in turn controls the transconductance (gm) (gain) of the transconductance amplifier 114.

The oscillation amplitude controller 132 determines whether the up/down counter 126 increments, decrements or maintains its present count value based upon the oscillation amplitude at the OSCI node (oscillation voltage on the crystal 116). For example, but is not limited to, the oscillation amplitude detector 134 may convert the AC signal (oscillation) on the OSCI node to a DC voltage representative of the amplitude of this AC oscillation signal. This DC voltage may be coupled to the oscillation amplitude controller 132.

When the oscillation amplitude is less than or equal to a low reference voltage, Vref_L, the oscillation amplitude controller 132 will enable the up/down counter 126 to increment its count value at each Update clock pulse. When the oscillation amplitude is greater than the low reference voltage, Vref_L, and less than a high reference voltage, Vref_H, the oscillation amplitude controller 132 will inhibit the up/down counter 126 from incrementing or decrementing its count value. And when the oscillation amplitude is equal to or greater than the high reference voltage, Vref_H, the oscillation amplitude controller 132 will enable the up/down counter 126 to decrement its count value at each Update clock pulse.

The oscillator failure detection and alarm 154 may also be provided for detection of a failure of the crystal oscillator 110 to start oscillating within a certain time period and provide an alarm thereof.

Figure 2:
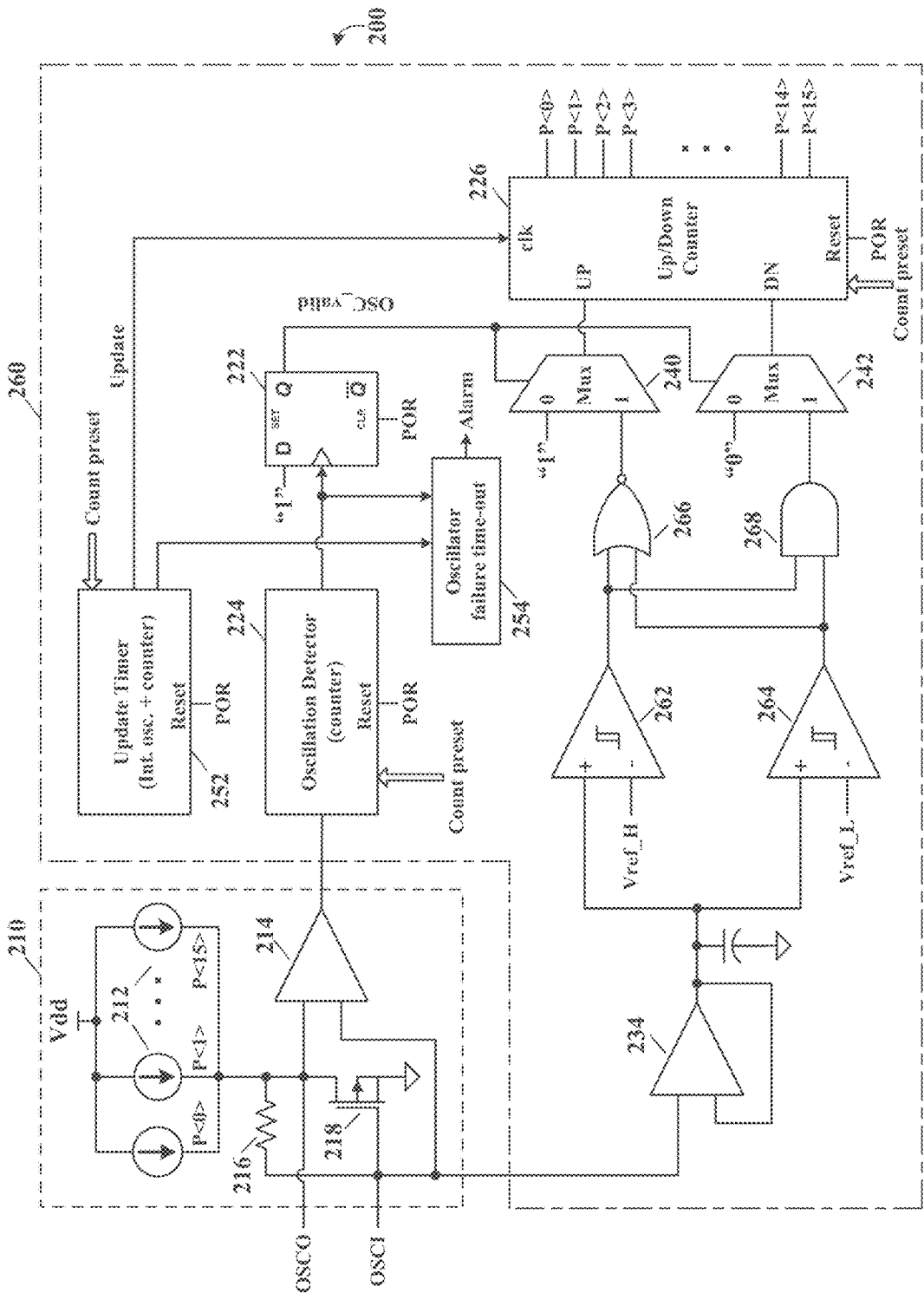
FIG. 2 illustrates a more detailed schematic diagram of an integrated circuit crystal oscillator having digital AGC comprising oscillation detection and amplitude control loops, according to a specific example embodiment of this disclosure

Referring to FIG. 2, depicted is a more detailed schematic diagram of an integrated circuit crystal oscillator having digital AGC comprising oscillation detection and amplitude control loops, according to a specific example embodiment of this disclosure. The integrated circuit, generally represented by the numeral 200, may comprise an oscillator circuit 210, that may be coupled to an external crystal (not shown), and a digital AGC circuit 260. The external crystal (not shown) may be coupled to the oscillator circuit 210 through nodes (pins) OSCI and OSCO of the oscillator circuit 210. The digital AGC circuit 260 may comprise an oscillation detector 224, a D-latch 222, an update timer 252, an up/down counter 226, multiplexers 240 and 242, an oscillation envelope detector 234, voltage comparators 262 and 264 with hysteresis, a NOR gate 266 and an AND gate 268. The oscillator circuit 210 may comprise a transistor 218 whose transconductance (gm) is controlled by current from a selection of a plurality of constant current sources 212, a feedback resistor 216, and may further include a buffer amplifier 214 coupled to the output (drain) of the transistor 218. The external crystal provides a low impedance feedback path between the drain and gate of the transistor 218 at the crystal design frequency. An oscillator failure time-out alarm circuit 254 may also be provided for detection of an oscillator circuit failure to start within a certain time period and provide an alarm thereof.

Upon initial power-up of the integrated circuit 200, a power-on-reset (POR) may be generated or at any time a reset may be asserted to initialize the digital AGC circuit 260. The initialization of the digital AGC circuit 260 may comprise clearing (setting digital count and state values to zero) the counter in the oscillation detector 224, the D-latch 222 Q-output set to a logic low (cleared), and resetting (clearing) the up/down counter 226 to its lowest, e.g., zero value. It is contemplated and within the scope of this disclosure that any one or more of the counters may be preloaded with a non-zero value ("count preset"), but for simplicity of explanation herein all counters/latch values will be cleared (reset) to zero.

After initialization of the digital AGC circuit 260 the lowest value of current from the plurality of constant current sources 212 may be applied to the transistor 218 so that its transconductance (gm) is at a minimum. Under this condition the oscillator circuit 210 may or may not oscillate, but it doesn't matter since the timer 252 is independent of the oscillator circuit 210. The timer 252 may be a very simple resistor-capacitor (RC) free running oscillator driving a counter. The counter in the timer 252 may be fixed in design or may be programmable (not shown) and may be used to define the initial (first) loop control bandwidth/update rate, as more fully explained hereinafter. Initially the D-latch 222 Q-output is at a logic low ("0") ("OSC_valid") which forces the output of the multiplexer 240 to a logic high ("1") and the output of the multiplexer 242 to a logic low ("0"). These two multiplexer outputs are applied to the Up and Down controls of the up/down counter 226, wherein the counter 226 will increment its count value each time it receives an Update clock pulse from the timer 252.

The clock rate output from the timer 252 (independent internal oscillator and counter) may be defined and fixed during design/manufacture or the internal counter may be programmable so as to be more flexible for use with crystals having different characteristics and/or frequencies. Preferably, the output clock frequency of the timer 252 (defines the bandwidth of the initial first servo loop) may be slow enough to be less than Tau ($\tau$)=10*Lm/R_eff: the start-up time required for the oscillation envelope of the crystal oscillator to grow for oscillation. The timer 252 output clock frequency is very easy to achieve. Therefore, the clock rate output from the timer 252 defines the digital AGC loops bandwidth/update-rates, thus there is no loop stability issues.

The up/down counter 226 may increment or decrement a count value therein each time it receives a clock pulse from the timer 252. This count value may be used to control selection of which ones of the plurality of constant current sources 212 are coupled to the transistor 218 for control of its transconductance (gm). Before any clock is received by the up/down counter 226 (and the count value thereof is set to zero) wherein a minimum current value is coupled to the transistor 218. Thus, the transistor 218 starts at a minimum transconductance (gm) value, and each time the up/down counter 226 receives a clock pulse from the timer 252, a linear thermometric pattern of constant current sources 212 may be enabled (linearly increasing current) thereby providing more current to the transistor 218, thus raising its transconductance (gm) until the oscillator circuit 210 starts to oscillate if it did not start to oscillate at the initial lowest current transconductance (gm) value.

Once the transistor 218 begins to oscillate the buffer amplifier 214 starts to drive the oscillation detector 224 (counter) until there is an overflow count output to the clock input of the D-latch 222. An example implementation for the oscillation detector 224 may be a counter that counts the received oscillation waveforms (cycles) from the oscillator circuit 210 (output of buffer amplifier 214) a certain number of times before outputting a count overflow clock. For example, the count number may be 128, e.g., a count overflow occurs after receiving 128 oscillation cycles.

When the overflow output therefrom clocks the D-latch 222 its Q-output will go from a logic low ("0") to a logic high ("1") and stay at that logic level until reset by an integrated circuit reset event, e.g., POR. OSC_valid represents the logic state of the Q-output of D-latch 222. When OSC_valid is at a logic low ("0") the multiplexer 240 output will be fixed at a logic high ("1") and the multiplexer 242 output will be fixed at a logic low ("0"), whereby the up/down counter 226 will always increment its count value every time it receives an Update clock pulse from the timer 252. However, once the OSC_valid is at a logic high ("1") the multiplexer 240 output will follow the output from the NOR gate 266 and the multiplexer 242 output will follow the output from the AND gate 268.

The oscillation envelope detector 234 converts the AC signal (oscillation) on the OSCI node to a DC voltage representative of the amplitude of this AC oscillation signal. This DC voltage is coupled to the positive inputs of voltage comparators 262 and 264. A Vref_H voltage is coupled to the negative input of the voltage comparator 262 and a Vref_L voltage is coupled to the negative input of the voltage comparator 264. Vref_H is greater than Vref_L. When the DC voltage from the oscillation envelope detector 234 is less than Vref_L and Vref_H, the outputs from the voltage comparators 262 and 264 are both at a logic low ("0"). When the DC voltage from the oscillation envelope detector 234 is less than Vref_H but equal to or greater than Vref_L, the output from the voltage comparator 262 is at a logic low ("0") and the output from the voltage comparator 264 is at a logic high ("1"). When the DC voltage from the oscillation envelope detector 234 is greater than Vref_L and equal to or greater than Vref_H, the outputs from the voltage comparators 262 and 264 are both at a logic high ("1"). Vref_H may be, for example but is not limited to, about 300 millivolts above the DC bias point of the crystal driver transistor 218. Vref_L may be, for example but is not limited to, about 100 millivolts above the DC bias point of the crystal driver transistor 218.

The outputs from the voltage comparators 262 and 264 are logically combined in the NOR gate 266 and the AND gate 268 (outputs) as follows:

| C 262 | C 264 | NOR 266 | AND 268 |
|---|---|---|---|
| Low | Low | High | Low |
| Low | High | Low | Low |
| High | High | Low | High |

The outputs of the multiplexers 240 and 242 follow the outputs of the NOR gate 266 and the AND gate 268, respectively. Wherein when the up/down counter 226 UP input is at a logic high and the Down input is at a logic low, the up/down counter 226 will increment its count value each time it receives an Update clock pulse from the update timer 252. When the UP and Down inputs are both at logic low the count value of the up/down counter 226 will not change irrespective of Update clock pulses from the update timer 252. And when the UP input is at a logic low and the Down input is at a logic high the up/down counter 226 will decrement its count value each time it receives an Update clock pulse from the update timer 252. Thus, the current to the transistor 218 (and its gm) may be increased, stay the same, or decreased depending upon the DC voltage from the oscillation envelope detector 234 being less than both the Vref_H and Vref_L voltage references, equal to or greater than the Vref_L reference and less than the Vref_H reference, or equal to or greater than the Vref_H voltage reference; respectively. The P<n> outputs of the up/down counter 226 may control which ones of the plurality of constant current sources 212 are coupled to the transistor 218.

The oscillator failure time-out alarm circuit 254 may compare a timeout time from the update timer 252 to the oscillation detection from the oscillation detector 224. If the update timer 252 timeout is less than oscillation detection (or no oscillation detection occurs) the oscillator failure time-out alarm circuit 254 may issue an alarm indicating failure of the oscillator 210 to start. The integrated circuit 200 may be, for example but is not limited to, a microcontroller, a digital signal processor (DSP), a microcomputer, a programmable logic array (PLA), an application specific integrated circuit (ASIC) and the like.

Figure 3:
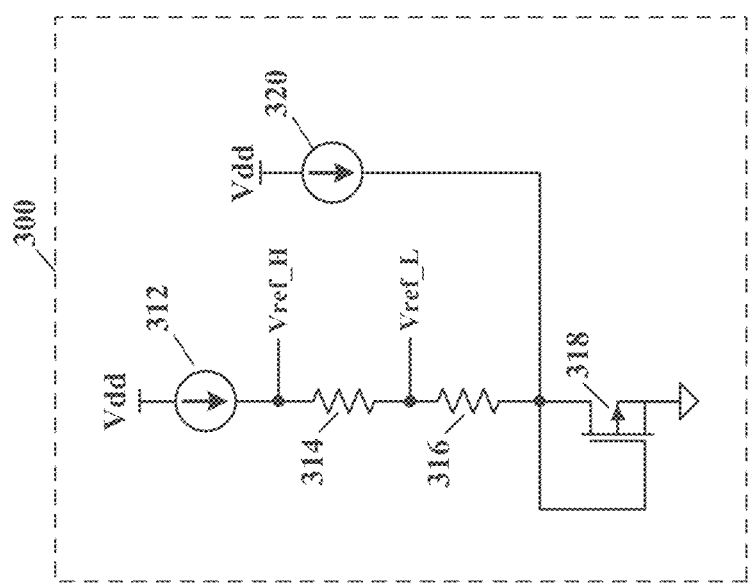
FIG. 3 illustrates a schematic diagram of a replica circuit of the crystal driver circuit, according to a specific example embodiment of this disclosure.

Referring to FIG. 3, depicted is a schematic diagram of a replica circuit of the crystal driver circuit.

Referring to FIG. 3, depicted is a schematic diagram of a replica circuit of the crystal driver circuit. The replica circuit 300 may comprise a constant current source 312, a first resistor 314, a second resistor 316, a replica adjustable current source 320, and a transistor 318 that may have substantially similar characteristics to the oscillator transistor 218. This replica circuit may advantageously provide appropriate voltages for Vref_H and Vref_L, that may track the PVT (Power, Voltage and Temperature) characteristics of the crystal oscillator transistor 218. Vref_H may be, for example but is not limited to, about 300 millivolts above the DC bias point of the crystal oscillator transistor 218. Vref_L may be, for example but is not limited to, about 100 millivolts above the DC bias point of the crystal oscillator transistor 218. Also, the reference points (Vref_H, and Vref_L) may move up and down accordingly to the current changes from the plurality of constant current sources 212 to track the bias point change of the oscillation transistor 218 (main driver circuit with respect to the change of the current value from the plurality of constant current sources 212.

Figure 4:
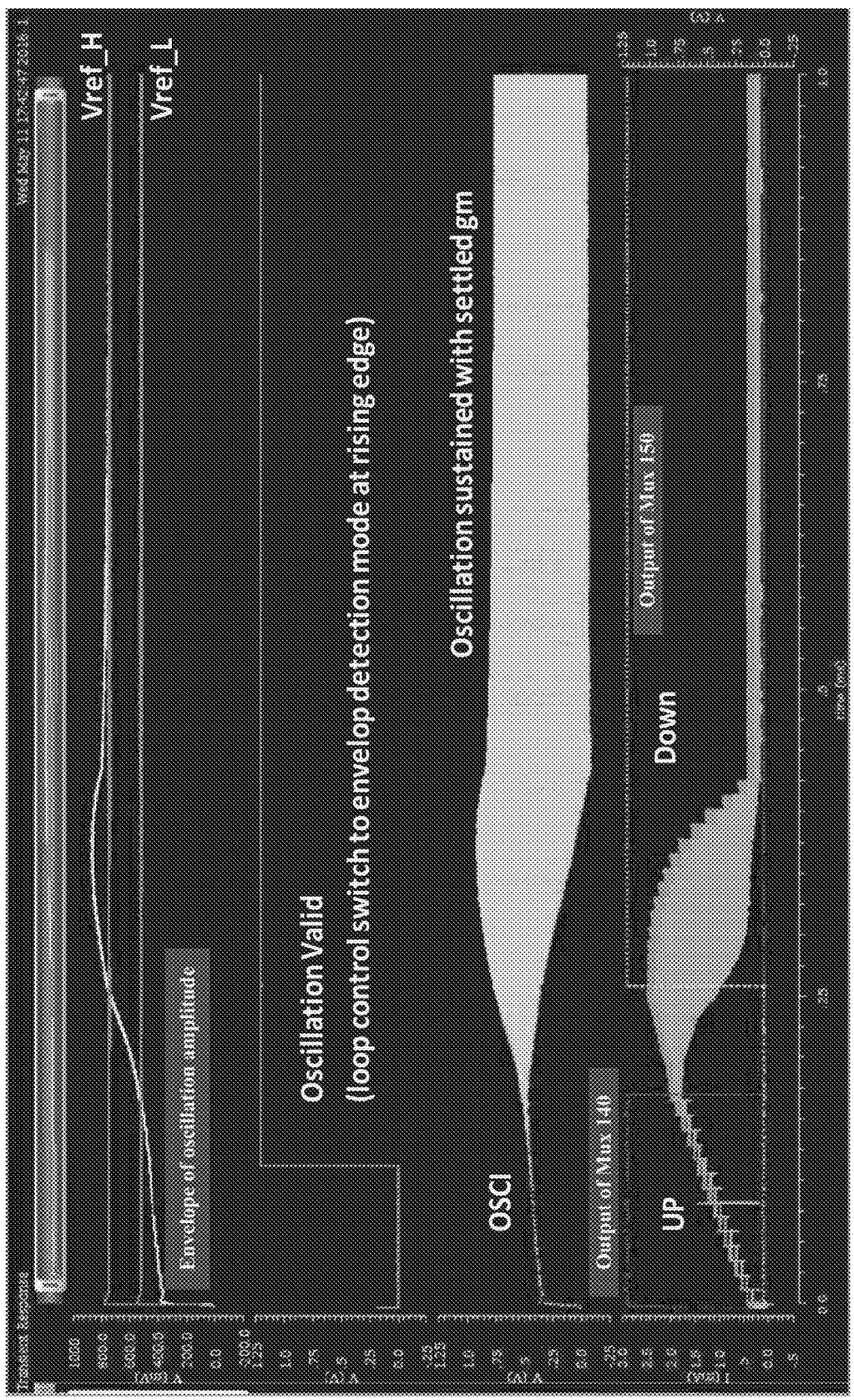
FIG. 4 illustrates a graphical representation of the operation of the crystal oscillator in combination with the digital AGC, according to specific example embodiments of this disclosure.

Referring now to FIG. 4, depicted is a graphical representation of the operation of the crystal oscillator in combination with the digital AGC circuit, according to the teachings of this disclosure. After a certain number of cycles (e.g., 128) have been counted by the oscillation detector 124/224 the OSC_valid signal goes from a logic low to a logic high. This cycle counting operation may be performed by a first digital control loop (oscillation detection loop) when the OSC_valid signal is at a logic low. A second digital control loop (oscillation amplitude control loop) takes over from the first digital control loop when the OSC_valid signal is at a logic high. In the first control loop the amplitude of the oscillation is ignored, only the number of cycles thereof are counted until a certain number thereof are detected and counted by the oscillation detector 124/224. If that cycle count is not achieved by the time of an Update clock pulse from the update timer 152/252 then the count value (initially starts at zero) of the up/down counter 126/226 is incremented until the expected number of oscillation cycles are counted, e.g., oscillation has not yet occurred due to inadequate gm of the transconductance amplifier 114/transistor 218, e.g., current too low to start oscillation thereof. Once that expected number of oscillation cycles are counted, then the second control loop becomes active and the current into the transconductance amplifier 114/transistor 218 is controlled by the second digital loop circuit that maintains the DC amplitude from the oscillation envelope detector 134/234 within Vref_H and Vref_L.

One of the key differences between the above digital AGC and an analog AGC implementation for a crystal oscillator is that most of the analog AGC loops rely on initial oscillation from the crystal oscillator for the analog loop to operate correctly, which does not have an ability to make oscillation happen even though the given transconductance (gm) setting is not high enough for the initial start-up of oscillation whereas the digital control AGC circuit has completely decoupled loop update rate (finding proper gm value to make the oscillation happen) which can be chosen independently.

The second difference is that the mostly digital nature of the digital AGC circuit allows it to have two thresholds within which the loop tries to maintain the OSCI signal swing (which assures lower power consumption once it settles and enhances pure signal quality, namely, less frequency jitter).

The third difference is that if oscillation does not start even with the highest transconductance (gm) value, then the digital AGC circuit sends out an oscillation fail signal. Many analog AGC loops rely on having a number of transitions to determine an oscillation output or having a certain value of signal amplitude which can die as there is no built-in hysteresis in the loop.

Unlike the analog AGC approach, the digital AGC architecture disclosed herein may be embedded in a fully synchronous digitally programmable timer by reusing the internal oscillator that may be used for gm (loop update counter 128 shown in FIG. 1) control. Also, the digital AGC circuit 120 may use a PVT (Power, Voltage and Temperature) threshold tracking circuit (shown in FIG. 3) to generate reference voltages Vref_H and Vref_L used by the voltage comparators 262 and 264 to ensure proper crystal oscillator circuit operation.

Another advantage is that as lower process geometry transistor characteristics become worse and worse, having an all-digital AGC circuit reduces design cycle time selection of the transistors used.

The proposed integrated circuit may be used for automotive safety applications when it is essential to meet the requirements of stability and avoid over driving the crystal. Further, the proposed integrated circuit may be used across multiple computing device divisions and/or platforms, including without limitation: 16-bit and/or 32-bit microcontrollers; portable device platforms such as Windows Portable Devices (WPD) and/or Wearable Smart Gateway; and the like.

The invention claimed is:

1. A method for operating a crystal oscillator of an integrated circuit, said method comprising the steps of:
monitoring operation and controlling oscillation amplitude of a crystal oscillator with a digital automatic gain control (AGC) circuit coupled with the crystal oscillator, the digital AGC circuit comprising a first loop including an oscillation detector, wherein the oscillation detector comprises a counter receiving the clock signal from the crystal oscillator and generating an output signal after a predetermined number of cycles have been detected, wherein the output signal sets an oscillation detection latch and a second loop including an oscillation amplitude detector receiving an input signal of the crystal oscillator;
increasing gain of the crystal oscillator until oscillation therefrom is detected with the first loop, and
maintaining the oscillation at an amplitude between a high reference value and a low reference value with the second loop.

2. The method according to claim 1, further comprising the steps of:
generating independent update clock pulses; and
increasing gain of a transconductance amplifier of the crystal oscillator at each update clock pulse if the oscillation detection latch has not yet been set.

3. The method according to claim 2, wherein the step of maintaining the oscillation amplitude between the high and low reference values comprises the steps of:
comparing outputs from the oscillation amplitude detector with the high and low reference values;
increasing the transconductance amplifier gain at each update clock pulse if the output from the oscillation amplitude detector is less than the low reference value, and
decreasing the transconductance amplifier gain at each update clock pulse if the output from the oscillation amplitude detector is equal to or greater than the high reference value.

4. The method according to claim 2, wherein the transconductance amplifier gain is increased by increasing current thereto.

5. The method according to claim 1, further comprising the step of generating a crystal oscillator failure alarm when the oscillation detector does not detect an oscillation from the crystal oscillator within a certain time period.

6. The method according to claim 1, wherein the high reference value is 300 millivolts above a DC bias point of a transistor of the crystal oscillator, and the low reference value is 100 millivolts above the DC bias point of the transistor.

7. The method according to claim 2, further comprising the step of providing the high and low reference values that track power, voltage and temperature characteristics of the transconductance amplifier with a replica circuit.

8. The method according to claim 1, further comprising the steps of detecting an oscillator failure and providing an alarm thereof.

9. An integrated circuit, comprising:
a crystal oscillator circuit comprising a transconductance amplifier adapted for coupling to an external crystal and a programmable current source coupled to and controlling transconductance gain of the transconductance amplifier; and
a digital automatic gain control (AGC) circuit coupled with the crystal oscillator circuit, the AGC circuit comprising a first loop including an oscillation detector, wherein the oscillation detector (124; 224) comprises a counter receiving the clock signal from the crystal oscillator (110; 210) and generating an overflow signal after a predetermined number of cycles have been detected; and a second loop including an oscillation amplitude detector receiving an input signal of the crystal oscillator;
wherein the first loop is adapted to increase gain of the crystal oscillator circuit until said predetermined number of cycles has been detected, and thereafter the second loop is adapted to maintain the oscillation amplitude between high and low amplitude values,
wherein the first loop controls the programmable current source at update intervals before detection of oscillation from the crystal oscillator circuit; and
wherein the second loop controls the programmable current source at the update intervals after the detection of the oscillation from the crystal oscillator circuit.

10. The integrated circuit according to claim 9, wherein:
the first loop comprises: the oscillation detector,
a memory latch coupled to the oscillation detector and changing logic state when the oscillation is detected, and
an up/down counter coupled to and controlling the programmable current source;
the second loop comprises:
the oscillation amplitude detector having an input coupled with an input of the transconductance amplifier and an output representing the oscillation amplitude,
the up/down counter; and
an oscillation amplitude controller coupled between the oscillation amplitude detector and the up/down counter,
wherein:
if the oscillation amplitude is less than the low amplitude value then the up/down counter is configured to increment count values therein at the update intervals, and
if the oscillation amplitude is equal to or greater than the high amplitude value then the up/down counter is configured to decrement the count values therein at the update intervals.

11. The integrated circuit according to claim 9, wherein the high amplitude value is 300 millivolts above a DC bias point of the transconductance amplifier, and the low amplitude value is 100 millivolts above the DC bias point of the transconductance amplifier.

12. The integrated circuit according to claim 9, further comprising a replica circuit adapted to provide the high and low amplitude values that track power, voltage and temperature characteristics of the transconductance amplifier.

13. The integrated circuit according to claim 10, wherein the count value of the up/down counter and/or the oscillation detection circuit is programmable.

14. The integrated circuit according to claim 10, wherein the up/down counter is adapted to be reset upon a power-on-reset in the integrated circuit.

15. The integrated circuit according to claim 10, wherein the timer, oscillation detection circuit, latch and/or up/down counter are resettable upon a reset condition in the integrated circuit.

16. The integrated circuit according to claim 9, further comprising an oscillator failure alarm circuit.

17. The integrated circuit according to claim 9, wherein the integrated circuit is a microcontroller.

18. An integrated circuit comprising:
a crystal oscillator;
a digital automatic gain control (AGC) circuit coupled with the crystal oscillator and configured to monitor operation and to control oscillation amplitude of the crystal oscillator, the digital AGC circuit comprising a first loop including an oscillation detector, wherein the oscillation detector comprises a counter receiving the clock signal from the crystal oscillator and being configured to generate an output signal after a predetermined number of cycles have been detected,
an oscillation detection latch coupled with the oscillation detector receiving the output signal of the oscillation detector, wherein the oscillation detection latch is configured to be set when the predetermined number of cycles have been detected,
wherein the digital AGC circuit comprises a second loop including an oscillation amplitude detector receiving an input signal of the crystal oscillator; and
wherein the digital AGC circuit is further configured to increase gain of the crystal oscillator until oscillation therefrom is detected with the first loop and to maintain the oscillation at an amplitude between a high reference value and a low reference value with the second loop.

19. The integrated circuit according to claim 18, further comprising:
an update timer for generating independent update clock pulses,
wherein the crystal oscillator comprises a transconductance amplifier and wherein the digital AGC circuit is further configured to increase gain of the transconductance amplifier at each update clock pulse if the oscillation detection latch has not yet been set.

20. The integrated circuit according to claim 19, further comprising a comparator circuit configured to compare outputs from the oscillation amplitude detector with the high and low reference values,
wherein the digital AGC circuit is configured to increase the transconductance amplifier gain at each update clock pulse if the output from the oscillation amplitude detector is less than the low reference value and to decrease the transconductance amplifier gain at each update clock pulse if the output from the oscillation amplitude detector is equal to or greater than the high reference value.

21. The integrated circuit according to claim 19, further comprising a programmable current source coupled with the transconductance amplifier.

* * * * *